United States Patent [19]
Sidor et al.

[11] 3,988,710
[45] Oct. 26, 1976

[54] CONTACTLESS LINEAR ROTARY POTENTIOMETER

[75] Inventors: Edward Frank Sidor, Lombard; Frank B. Desio, Melrose Park, both of Ill.

[73] Assignee: Illinois Tool Works Inc., Chicago, Ill.

[22] Filed: Nov. 24, 1975

[21] Appl. No.: 634,807

[52] U.S. Cl. .............................. 338/32 R; 307/309; 323/94 H; 336/110; 338/68
[51] Int. Cl.² ......................................... H01L 43/08
[58] Field of Search ............... 338/32 R, 32 H, 32 S, 338/12, 68; 323/94 H; 336/110; 307/309; 335/206; 324/45, 46, 151 R

[56] References Cited
UNITED STATES PATENTS

| | | | |
|---|---|---|---|
| 3,331,045 | 7/1967 | Weiss et al. | 338/32 R |
| 3,335,384 | 8/1967 | Weiss | 338/32 R X |
| 3,476,997 | 11/1969 | Otzipka et al. | 307/309 X |
| 3,671,854 | 6/1972 | Masuda | 338/32 H X |
| 3,689,836 | 9/1972 | Snyder | 324/46 X |

*Primary Examiner*—J. V. Truhe
*Assistant Examiner*—David A. Tone
*Attorney, Agent, or Firm*—Glenn W. Bowen; Robert W. Beart

[57] ABSTRACT

A contactless potentiometer which has a linear output characteristic is constructed with a pair of elongated, hollow cylindrical tubes which are made of magnetically saturable material and are aligned so that their axes form an angle less than 180°, with both of said tubes having at least one conductive wire coupled therewith which is interconnected with the wire that is coupled with the other tube, and a moveable magnet which is formed as a segment of a circle with a pair of straight sides that move adjacent to said tubes so that the total volume of said tubes that is magnetically saturated remains substantially constant while the inductance ratio of the tubes varies.

10 Claims, 2 Drawing Figures

U.S. Patent   Oct. 26, 1976   3,988,710
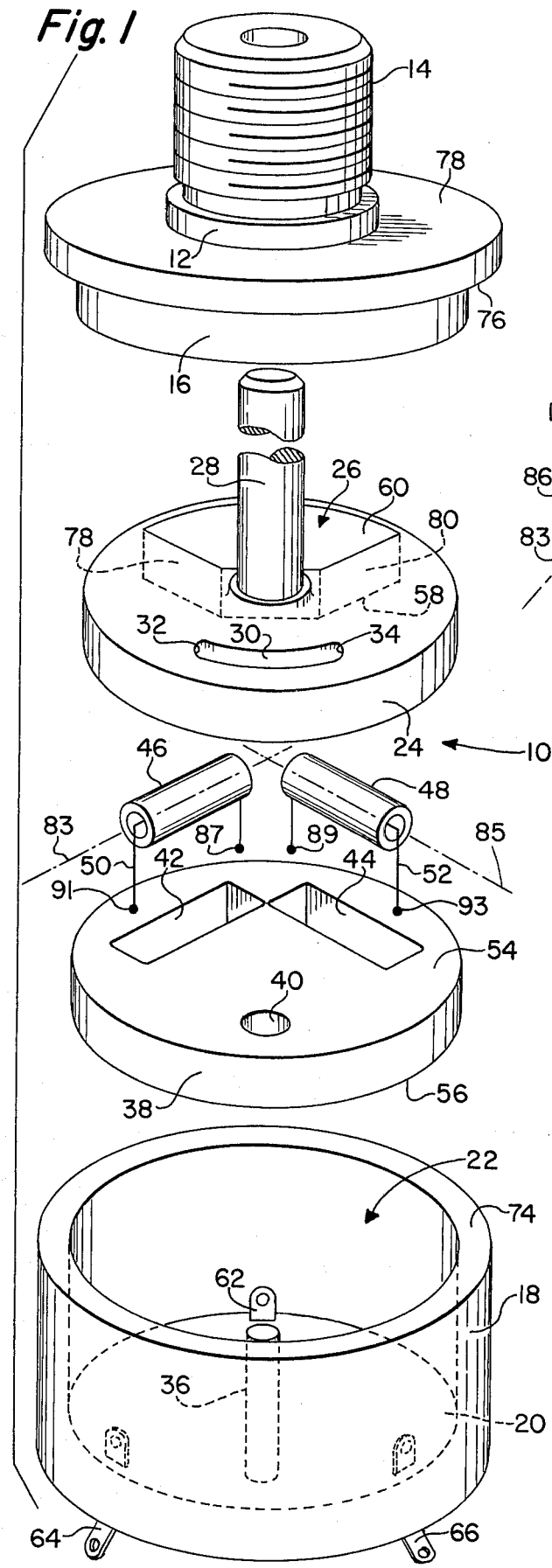
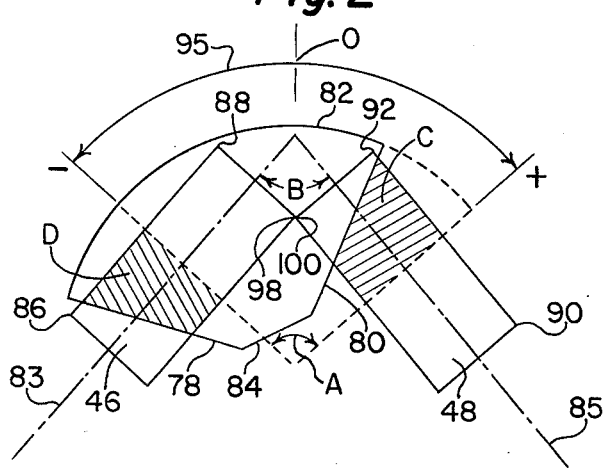

CONTACTLESS LINEAR ROTARY POTENTIOMETER

BACKGROUND OF THE INVENTION

Various contactless rotary potentiometers have been proposed for providing a linear output response. Contactless potentiometers, of course, are advantageous over resistive type potentiometers because they have a considerably longer lifetime. Although contactless potentiometers which utilize a rotating permanent magnet section and a sensing element were previously known, these proved to have several decided disadvantages; the major disadvantage of such prior devices being that they generally required that the magnet or the sensing element, or both, be formed with a special precalculated shape in order to obtain the desired linearity. This obviously made these potentiometers relatively costly to produce and in addition the shapes required could result in unduly increasing the size of the potentiometers. Examples of such devices are shown in U.S. Pat. No. 3,335,384, issued Aug. 8, 1967 to Herbert Weiss, and in co-pending U.S. Patent Application Ser. No. 613,156 filed Sept. 15, 1975 in the name of Victor M. Bernin, and assigned to the Assignee of the present invention.

The design of the present invention provides excellent linearity in a contactless potentiometer by using cylindrical or rectangular sensing elements and a rotatable permanent magnet segment, which may be merely a segment of a circle with relatively straight sides that pass over said sensing elements and intersect the longitudinal axes of the sensing elements. Thus, the cost of construction of the potentiometer is relatively low. Furthermore, the size of the potentiometer is also maintained relatively small due to the fact that the sensing elements are aligned at an angle and are not spaced in line with each other, as has been proposed for prior contactless potentiometers.

Other notable advantages of the disclosed contactless potentiometer embodiment are that it is highly resistant to shocks and vibrations, which resistive potentiometers are not, and that it is capable of operating up to temperatures as high as 200° C.

DESCRIPTION OF THE DRAWING

The present invention is described herein by reference to the drawings in which:

FIG. 1 is an exploded perspective view of the potentiometer of the invention; and FIG. 2 is a diagram which illustrates the relationship of the shape of the rotatable permanent magnet and the sensing elements.

TECHNICAL DESCRIPTION OF THE INVENTION

The described embodiment of the present invention is shown in the exploded perspective drawing of FIG. 1. The potentiometer 10 is formed of an upper housing member 12, which has a threaded stem 14, a lower circular bushing 16, and a lower housing member 18, which has a closed bottom 20 and is open at the top 22.

A disc-shaped rotor 24 of electrically insulating material, has a permanent magnet 26 inserted into it and the upstanding shaft 28 is secured to it so they may all rotate as a unit with the shaft. The rotor 24 also has an elongated curved slot 30 in it, which is located diametrically opposite the permanent magnet 26 which serves to limit the number or degrees of rotation that the rotor 24 may undergo due to interaction of the ends 32, 34 of the groove 30, and the upstanding post 36 which is secured to the bottom 20 of the lower housing member 18.

A disc-shaped spacer 38 of electrically insulating material is positioned below the rotor which has a hole 40 in it which receives the post 36 and prevents the spacer 38 from rotating when the shaft 28 is turned. The spacer 38 also has a pair of elongated rectangular-shaped slots 42, 44 in it which are positioned on the same side of the spacer as is the permanent magnet 26. The recesses, or slots, 42, 44 receive the sensing elements 46, 48 therein. The sensing elements 46, 48 are preferably hollow, elongated cylindrical tubes that are made of magnetically permeable material and have conductive sensing wires 50, 52 running respectively therethrough so as to form two inductive elements. The slots 42, 44 are preferably deep enough so that when the elements 46, 48 are inserted into them the periphery of the elements lie wholly within the surfaces 54, 56 so as to enable the lower face 58 of the magnet 26 to pass directly over the slots 42, 44 without contacting the elements 46, 48.

The permanent magnet 26 is magnetized so that its lower face 58 has one magnetic polarity while its upper face 60 has the opposite magnetic polarity. If desired a second rotor (not shown) may be employed below the spacer 38 with a second magnet inserted into it, and with the second rotor also being secured to the shaft 28 to provide a better magnetic field distribution, but at an added cost.

The potentiometer 10 is assembled by positioning the lower surface 56 of the spacer 38 on the bottom 20 of the lower housing member 18, and then placing the rotor 24 on the top surface 54 of the spacer 38. The upper housing member 12 is positioned over the lower housing member 18 so that the bushing 16 is inserted in the lower housing member 18 to restrict vertical movement of the rotor 24 and the spacer 38, and the lower surface 76 of the disc-shaped cover portion 78 of the upper housing member 12 rests on the surface 74 of the lower housing member 18.

While it is preferred that the elements 46, 48 be constructed as described, it is apparent that the elements do not have to be in the form of a hollow cylindrical tube and may ultimately assume other forms including a solid cylindrical shape, or a solid or hollow rectangular shape, all of which are easily produced, and which form a substantially rectangular projection in the plane parallel to the surfaces 54, 56 of the spacer 38, as shown in FIG. 2. In addition, while a magnetically saturable ferrite material is preferred for the sensing elements it is apparent that they may comprise various other types of elements including Hall-effect, magnet resistive, Galvano-magnetic semiconductor, transformer coupled (which can be achieved with the disclosed embodiment merely by adding an additional current carrying conductive wire through each of the elements 46, 48 to act as a drive wire, with the wires 50, 52 still assuming the function of sense wires), and wound coil devices; providing the selected device is capable of being incrementally affected so as to produce an output signal that varies in direct correspondence with the rotation of an adjacent permanent magnet which has two substantially straight sides, such as the magnet 26 of the FIGS. 1 and 2 which is formed as a segment of a circle.

FIG. 2 shows the relationship between the shape of the elongated cylindrical or rectangular shaped elements 46, 48 and the permanent magnet 26. The most convenient way in which the magnet 26 may be formed is as a segment of a circle, as shown in FIG. 2, although the shape of the current outer edge 82 and the straight inner edge 84 is not of importance with respect to the operation of the potentiometer as long as they extend beyond the tubes 46, 48. The sides 78, 80 of the magnet 26 should, however, be substantially straight to provide the desired linearity. The angle A that is made by the sides 78, 80, extended as shown in FIG. 2, faces the angle B which is less than 180° and is formed by the intersection of the longitudinal axes 83, 85 respectively of the elements 46, 48, as shown in FIG. 2. The angle A is less than 180° and is further limited so that the sides 78 cannot pass beyond the edges 86, 88 of the tube 46, or the side 80 cannot pass beyond the edges 90, 92 of the tube 48, over the full range of rotation of the magnet 26 that is allowed by the slot 30 and the post 36. The edges 98, 100 of the tubes 46, 48, respectively, are positioned so they almost touch each other in order to allow the longitudinal axes 83, 85 of the tubes 46, 48 to form the angle B within a minimal space. The sides 78, 80 of the magnet 26, thus, intersect the axes 83, 85 of the tubes 46, 48.

The magnitude of the angle B thus is formed by the elongated axes 83, 85 of the elements 46, 48 influences the size of the potentiometer and the allowable range of rotation of the rotor 24, as determined by the extent of the slot 30. If the angle B is made smaller the size of the potentiometer 10 may be reduced somewhat, but the number of degrees of rotation of the rotor 24 that are allowable is also less. If the angle B is made larger the number of degrees of rotation of the rotor 24 may be increased, but the size of the potentiometer will also be larger. An angle B of approximately 80° is acceptable to accommodate both size and rotation requirements for many applications, with approximately 30° of rotation of the rotor 24 to either side of the center line 0 being allowable in this case, and with the angle A correspondingly being approximately 100°.

In operation, the magnet 26 extends over the sensing elements 46, 48 so that the total volume of the sensing elements which is magnetically saturated (preferably so that substantially complete magnetic saturation occurs, whereby an increase in magnetic field strength will not produce any substantial further decrease in induction of the elements 46, 48) remains substantially constant. Thus, when the magnet 26 is positioned at its central position, as indicated by the dotted lines in FIG. 2, the volume of each of the elements 46, 48 that is saturated will be approximately equal. When the magnet 26 is rotated to the position shown by the full lines in FIG. 2 the decrease in the volume of the element 48 that is saturated, which is the portion labeled C in FIG. 2, will be approximately equal to the increase in the volume of the element 46 that is saturated, which is the portion labeled D in FIG. 2. The sense wires 50 and 52 are connected at their ends 87, 89 which are in turn connected to the terminal 62. The ends 91, 93 which are connected to the terminals 64, 66 may be coupled into a conventional differential sensing circuit in order to provide a circuit that produces an output signal which is representative of the rotation of the magnet 26 about the center line 0 in either a "positive" or a "negative" direction according to whether magnet 26 is undergoing clockwise or counter clockwise rotation, as indicated by the double headed arrow 95 of FIG. 2.

It will be apparent to those skilled in the art that a variety of embodiments may be devised within the scope of the appended claims which will be obvious in view of the embodiment described herein, and that these are intended to be encompassed within the scope of the claimed invention.

What is claimed is:

1. A rotary contactless potentiometer comprising first and second elongated sensing elements, each of which have a substantially straight longitudinal axis and are shaped to form a rectangular projection in a plane, said sensing elements being positioned so that said elongated axis intersect to form a first angle which is less than 180°, at least one permanent magnet positioned adjacent said sensing elements, rotation means coupled to said permanent magnet to provide for the rotation thereof and limit means constructed to limit the range of rotation of said permanent magnet by said rotation means relative to said sensing elements, said permanent magnet being shaped to have first and second substantially straight sides each of which passes adjacent one of said rectangular projections so as to intersect the associated longitudinal axis of said sensing elements, said sides lying along lines that intersect to form a second angle that faces said first angle and is less than 180° and is further limited so that neither of said sides can pass beyond the outer edges of the respective projection adjacent said side over the limited range of rotation of said permanent magnet that is allowed by said limit means, and so that the total area of said projections that are positioned adjacent said permanent magnet is substantially constant regardless of the relative position of said permanent magnet and said sensing elements within said limited range of rotation.

2. A rotary contactless potentiometer as claimed in claim 1, wherein each of said sensing elements comprise a hollow cylindrical shaped tube made of a magnetically saturable material and a sense wire that is coupled to said tube.

3. A rotary contactless potentiometer as claimed in claim 1 wherein said permanent magnet is formed so that said sides and an outer edge of said permanent magnet, which extends beyond said sensing elements, correspond in shape to a segment of a circle.

4. A rotary contactless potentiometer as claimed in claim 3 wherein each of said sensing elements comprise a hollow cylindrical shaped tube made of a magnetically saturable material and a sense wire that is coupled to said tube.

5. A rotary contactless potentiometer as claimed in claim 1 comprising a turning shaft, a disc-shaped spacer made of electrically insulating material and provided with first and second generally rectangular shaped slots which are aligned to substantially correspond to said rectangular shaped projections so that each of said slots receives one of said sensing elements therein, a disc-shaped rotor made of electrically insulating material which carries said permanent magnet adjacent said spacer, said turning shaft being affixed to said spacer and coupling means for receiving said spacer at a fixed location and for allowing said rotor to move rotably relative thereto over said limited range of rotation upon the application of a torque to said shaft.

6. A rotary contactless potentiometer as claimed in claim 5, wherein each of said sensing elements comprise a hollow cylindrical shaped tube made of a magnetically saturable material and a sense wire that is coupled to said tube.

7. A rotary contactless potentiometer as claimed in claim 6 wherein said permanent magnet is formed so that said sides and an outer edge of said permanent magnet, which extends beyond said sensing elements, correspond in shape to a segment of a circle.

8. A rotary contactless potentiometer as claimed in claim 1 comprising a housing, coupling means comprising a post secured to said housing and a spacer having an operative hole therethrough which is slightly larger than the size of said post and which receives said post and prevents said spacer from moving relative to said post and said rotor has an elongated curved slot therethrough which receives said post and allows said rotor to rotate over said limited range of rotation relative to said post.

9. A rotary contactless potentiometer as claimed in claim 8 wherein each of said sensing elements comprise a hollow cylindrical shaped tube made of a magnetically saturable material and a sense wire that is coupled to said tube.

10. A rotary contactless potentiometer as claimed in claim 9 wherein said permanent magnet is formed so that said sides and an outer edge of said permanent magnet, which extends beyond said sensing elements, define a permanent magnet in the shape of a segment of a circle.

* * * * *